US005594386A

United States Patent [19]

Dhuyvetter

[11] Patent Number: 5,594,386

[45] Date of Patent: Jan. 14, 1997

[54] PULSE WIDTH MODULATED AMPLIFIER

[75] Inventor: Timothy A. Dhuyvetter, San Jose, Calif.

[73] Assignee: Sipex Corporation, Billerica, Mass.

[21] Appl. No.: 426,391

[22] Filed: Apr. 21, 1995

[51] Int. Cl.[6] .................... H03F 3/217; H03F 3/45; H04R 25/00
[52] U.S. Cl. .................... 330/251; 381/68; 330/253
[58] Field of Search .................... 330/10, 207 A, 330/251, 253; 381/68, 111, 120, 121

[56] References Cited

U.S. PATENT DOCUMENTS

| 2,915,588 | 12/1959 | Bose | 179/1 |
|---|---|---|---|
| 3,038,964 | 6/1962 | Bose | 179/1 |
| 3,294,981 | 12/1966 | Bose | 307/88.5 |
| 4,015,213 | 3/1977 | Hanada | 330/10 |
| 4,456,872 | 6/1984 | Froeschle | 323/286 |
| 4,990,862 | 2/1991 | Narabu et al. | 330/253 |
| 5,006,817 | 4/1991 | Babanezhad | 330/253 |
| 5,160,896 | 11/1992 | McCorkle | 330/251 |
| 5,247,581 | 9/1993 | Gurcan | 381/68 X |

OTHER PUBLICATIONS

Gedaly Levin et al., *Designing with hysteretic current–mode control*, EDN–Design Feature, Apr. 28, 1994 pp. 95–102.

*Primary Examiner*—Steven Mottola
*Attorney, Agent, or Firm*—Testa, Hurwitz & Thibeault

[57] ABSTRACT

A class-D pulse width modulated amplifier. The amplifier includes a current switch, an integrator and a comparator connected in a feedback loop. The feedback loop generates an ultrasonic frequency carrier which is utilized in the pulse width modulation of an audio input signal. In one embodiment a current switch and an audio input source are in electrical communication with an integrator. The output signal of the integrator is the input signal to a phase split differential output comparator having hysteresis. The differential output signals of the comparator are the input signals both to a load and to the current switch, thereby completing the feedback loop. In one embodiment the current switch includes compression circuitry.

9 Claims, 12 Drawing Sheets

PULSE WIDTH MODULATED AMPLIFIER

FIELD OF THE INVENTION

The invention relates to audio amplifiers and more specifically to class-D amplifiers.

BACKGROUND OF THE INVENTION

A class-D amplifier, as known to the prior art, uses a square wave oscillator to generate an ultrasonic frequency carrier signal. The ultrasonic carrier signal in turn is integrated to form a triangular wave carrier signal. An audio signal is summed with this triangle wave carrier signal to generate a composite signal. The composite signal is applied to a comparator. The comparator generates a pulse width modulated (PWM) output signal in which the width of the pulse encodes the audio signal information.

In more detail, an example of such a class-D pulse width modulated amplifier known to the prior art is shown as a block diagram in FIG. 1. In this embodiment, a ultrasonic output square wave 10 of a square wave oscillator 12 is integrated by an integrator 14 to form a triangular wave carrier 16. The triangular wave carrier 16 is summed by a summer 22 with an audio signal 24 from an audio input 26 and the resulting composite signal 28 is applied to one input 30 of a comparator 32. The other input 34 of the comparator 32 is connected to a reference voltage 36. The output terminal 40 of comparator 32 is connected to the input terminal 42 of an inverter 44. The output terminal 46 of inverter 44 is connected both to one terminal 48 of a load 50, such as an audio transducer, and the input terminal 52 of a second inverter 54 whose output terminal 56 is connected to the second input terminal 58 of load 50.

As can be seen, the result of the summation of the audio signal and the triangular carrier signal is a modulated carrier which moves above and below the reference voltage level of the comparator. As a result, the output of the comparator will transition high as the composite signal exceeds the reference voltage level and will transition low when the composite signal goes below the reference voltage level.

Thus, the output of the comparator will be a series of pulses, the width each being determined by the length of time the composite signal spends above the reference voltage level. The series of pulses thus reflects the audio signal which formed the composite signal and is therefore a pulse width modulated analog of the audio signal.

Although the transducer load is exposed to both the audio signal and the ultrasonic carrier signal in the form of the modulated width pulse train, only the low frequency audio signal is converted to sound since the audio transducer load is primarily inductive. That is, since the impedance of the load increases with frequency, the high frequency portion of the signal is not converted to sound but is reflected back to the battery.

SUMMARY OF THE INVENTION

The invention relates to a class-D amplifier in which the oscillator is formed by the natural oscillation frequency of the amplifier circuit constructed as a feed back loop. In one embodiment, the amplifier includes a current switch whose output terminal is connected to one of the input terminals of an operational amplifier configured as an integrator. The other input of the integrator is connected to a reference voltage. An audio signal is applied through a resistor to the same input terminal as is connected to the current switch. The output signal of the integrator is the input signal to a comparator whose other input signal is a reference voltage. The comparator produces a phase split output signal, on each of two output terminals, which is applied to a respective buffer amplifier. The output of each buffer amplifier is in turn applied to audio transducer. In addition, the phase split output signals of the comparator are input signals to the current switch, thereby closing the feed back loop. The natural frequency of this feedback loop provides the ultrasonic frequency oscillations used as a carrier frequency. In one embodiment, the amplifier includes compression circuitry.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DESCRIPTION OF THE PREFERRED EMBODIMENT

Figure 1:
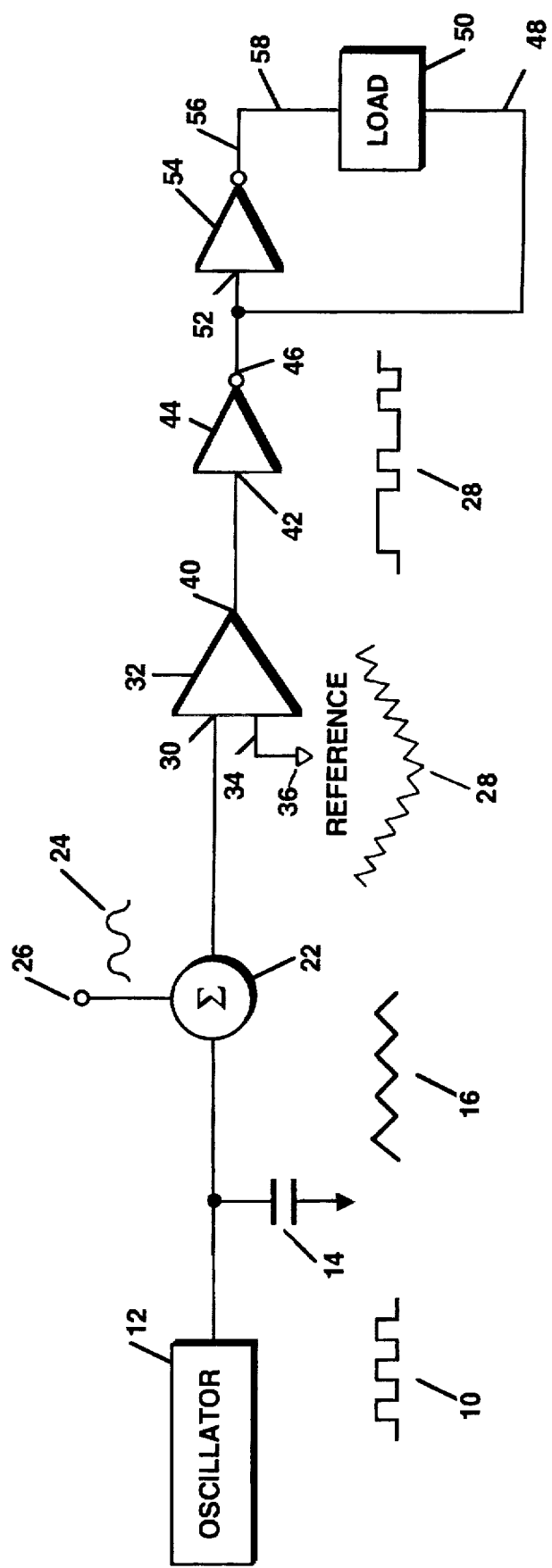
FIG. 1 is a block diagram of a class-D amplifier known to the prior art.
Figure 2:
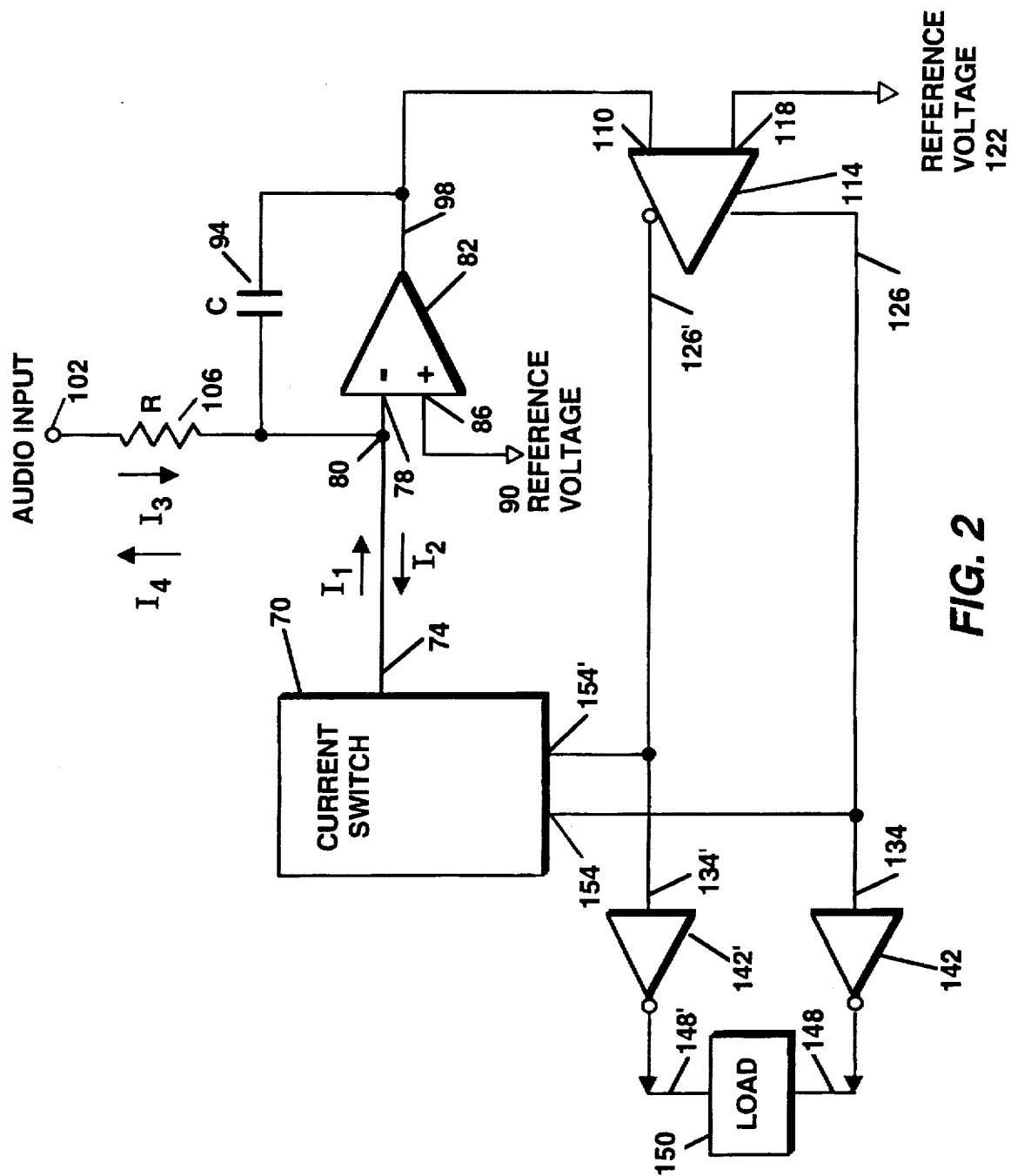
FIG. 2 is a block diagram of an embodiment of the amplifier of the invention.

Referring to FIG. 2 and in brief overview, an embodiment of a class-D amplifier constructed in accordance with the invention includes a current switch 70 having an output terminal 74 in electrical communication with the negative input terminal 78 of an operational amplifier 82 connected as an integrator. The positive input terminal 86 of the operational amplifier 82 is connected to a reference voltage 90. A capacitor 94 connected between the negative input terminal 78 and the output terminal 98 of the operational amplifier 82 causes the operational amplifier 82 to function as an integrator.

An audio signal is applied by way of an audio input terminal 102 to the negative input terminal 78 of the operational amplifier 82 through a resistor 106. The output terminal 98 of the operational amplifier 82 is connected to one input terminal 110 of a comparator 114, also referred to herein as a hysteresis switching comparator, which exhibits a switching hysteresis and whose other input terminal 118 is connected to a reference voltage 122.

The comparator 114 produces signals of two output terminals 126,126'. These signals are phase split with respect to each other. Each output terminal 126, 126' is connected to a respective input terminal 134, 134' of a respective driver 142, 142'. The output terminal of each driver 142, 142' is in electrical communication with a respective terminal 148, 148' of an audio transducer 150. In addition, each output terminal 126, 126' is in electrical communication with a respective input terminal 154, 154' of the current switch 70.

Considering the circuit in more detail, the current switch 70 is capable of both sourcing ($I_1$) and sinking ($I_2$) current from terminal 74. Whether the current switch 70 is acting as a source or a sink is determined by the signals on its input terminals 154, 154' which are provided by the differential output terminals 126, 126' of comparator 114. When no audio signal ($I_3=I_4=0$) is present, the differential output signals on the output terminals 126, 126' of comparator 114 have an opposite phase relationship; a 50% duty cycle; and nearly ground to supply voltage transitions. These output signals are a free running oscillation of a frequency ($f_o$) determined by the relationship:

$$f_o = \frac{I}{2CV}$$

where I is the switch current of the current switch 70, C is the value of the capacitor; and V is the voltage hysteresis (the total voltage difference between the upper ($V_H$ in FIG. 3) and lower ($V_L$ in FIG. 3) voltage switching thresholds). In one embodiment, the capacitor 94 is 39 pf, the switch current is about 5 µA, and the voltage hysteresis is about 0.5 V, resulting in an oscillation frequency of about 120 kHz.

The operational amplifier 82 is configured such that any imbalance of currents ($I_1,I_2,I_3,I_4$) at the common node 80 will cause the output value of the operational amplifier 82 to change in a direction so that the current ($I_c$ in FIG. 3) in capacitor 94 will reduce the imbalance of the currents at the common node 80 to zero. Thus, the output signal of the operational amplifier 82 will ramp up when the current switch acts 70 as a sink and will ramp down as the current switch 70 acts as a source. In the absence of an input signal ($I_3=I_4=0$), the current switch 70 sources and sinks equal amounts of current ($I_1=I_2$) causing the operational amplifier 98 to generate output voltage ramps having equal and opposite values. That is, the rate of change of the output voltage (dV/dt) will be equal and opposite for the current switch 70 sourcing and sinking equal currents, thereby forming a triangular wave.

The output of the comparator 114 changes state when the input signal from the integrator 82 exceeds the hysteresis threshold. The output signal of the comparator 114 determines whether the current switch 70 acts as a source or a sink. When the output of the comparator 114 changes state, the current switch 70 changes state so as to produce an opposite current at the common node 80, and hence at the input of the integrator 82, closing the feed back loop.

Figure 3:
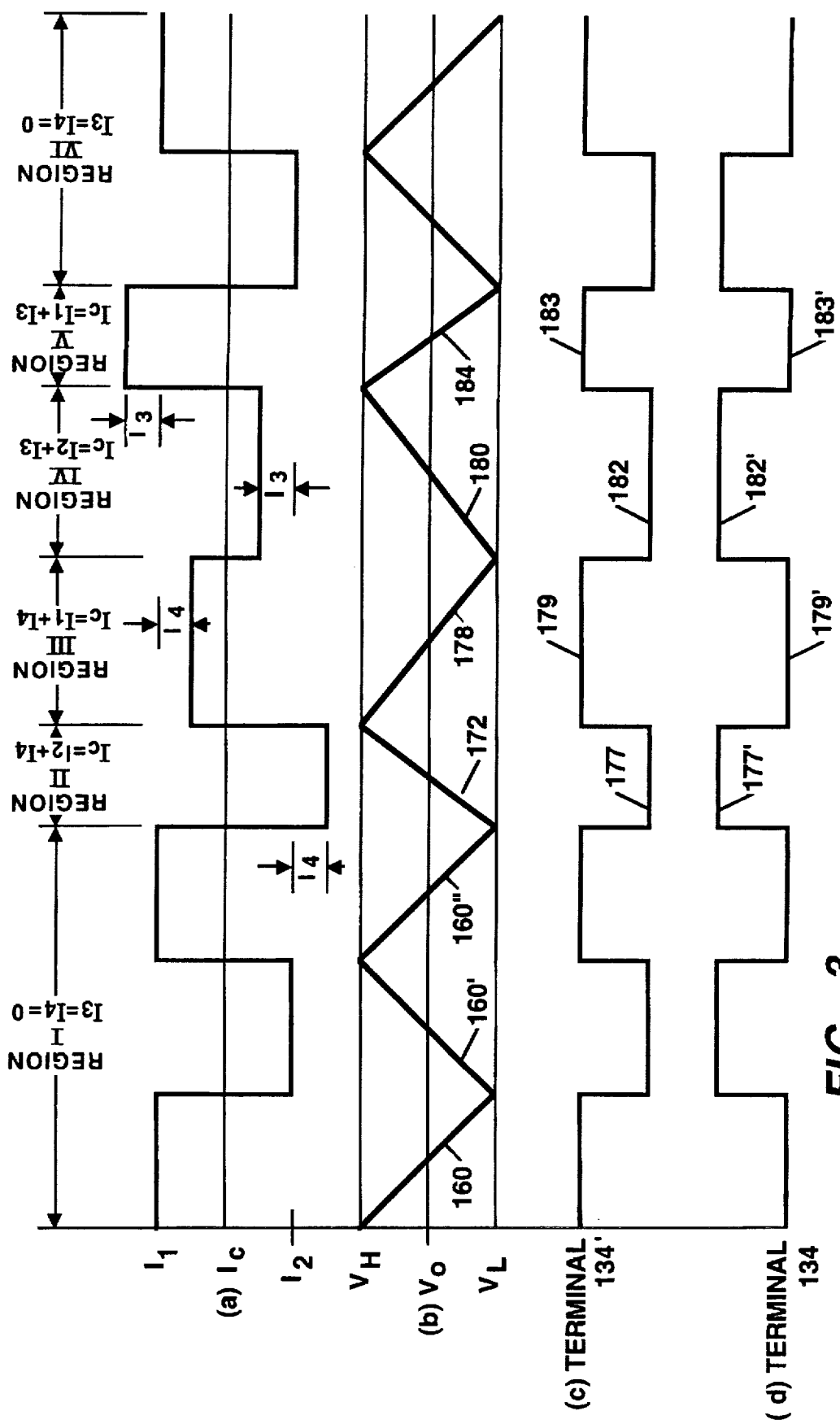
FIG. 3 is a series of waveforms produced by each stage of the embodiment of the amplifier shown in FIG. 2.

Referring to FIG. 3, waveform (a) depicts the current across the capacitor 94 under various input signal conditions. Waveform (b) depicts the input voltage to the comparator under the same conditions as waveform (a). Waveforms (c) and (d) the voltages on output terminals 134 and 134', respectively, of the comparator 114.

When there is no input audio signal ($I_3=I_4=0$), Region I, the currents balanced by the capacitor 94, and sourced ($I_1$) and sunk ($I_2$) by the current switch 70 are equal and opposite. As a result, the output of integrator 82 is a triangular wave with equal rising and falling slopes (160, 160', 160"). This triangular wave input to the comparator 114 produces signals on the output terminals 134 and 134' (waveforms (c) and (d)) of the comparator 114 having equal high and low duration. When $I_3$, and $I_4$ do not equal 0, the slope of the integrator output (dV/dt) which is equal to ($I_1+I_2+I_3+I_4$)/C (integrating capacitor 94) changes. Considering each of the possible conditions of current flow separately:

In Region II, where $I_c=I_2+I_4$, the combination of the audio signal ($I_4$) and the current sunk ($I_2$) by the current switch 70 is equal to the current across the capacitor 94, the rising edge 172 of the integrator output waveform (b) has a steeper slope, and the resulting comparator output waveforms (c and d) have correspondingly shorter durations 177, 177'.

In Region III, where $I_c=I_1+I_4$ that is, the combination of the audio signal ($I_4$) and the current sourced ($I_1$) by the current switch 70 is equal to the current across the capacitor 94, the falling edge 178 of the integrator output waveform (b) has a shallower slope and the resulting comparator output waveforms (c and d) therefore have correspondingly longer durations 179, 179'.

In Region IV, where $I_c=I_2+I_3$, that is, the combination of the audio signal ($I_3$) and the current sunk ($I_2$) by the current switch 70 is equal to the current across the capacitor 94, the rising edge 180 of the integrator output waveform (b) has a shallower slope, and the resulting comparator output waveforms (c and d) have correspondingly longer durations 182, 182'.

Finally, in Region V, where $I_c=I_1+I_3$, that is, the combination of the audio signal ($I_3$) and the current sourced ($I_1$) by the current switch 70 is equal to the current across the capacitor 94, the falling edge 184 of the integrator output waveform (b) has a steeper slope, and the resulting comparator output waveforms (c and d) have correspondingly shorter durations 183, 183'.

Figure 4:
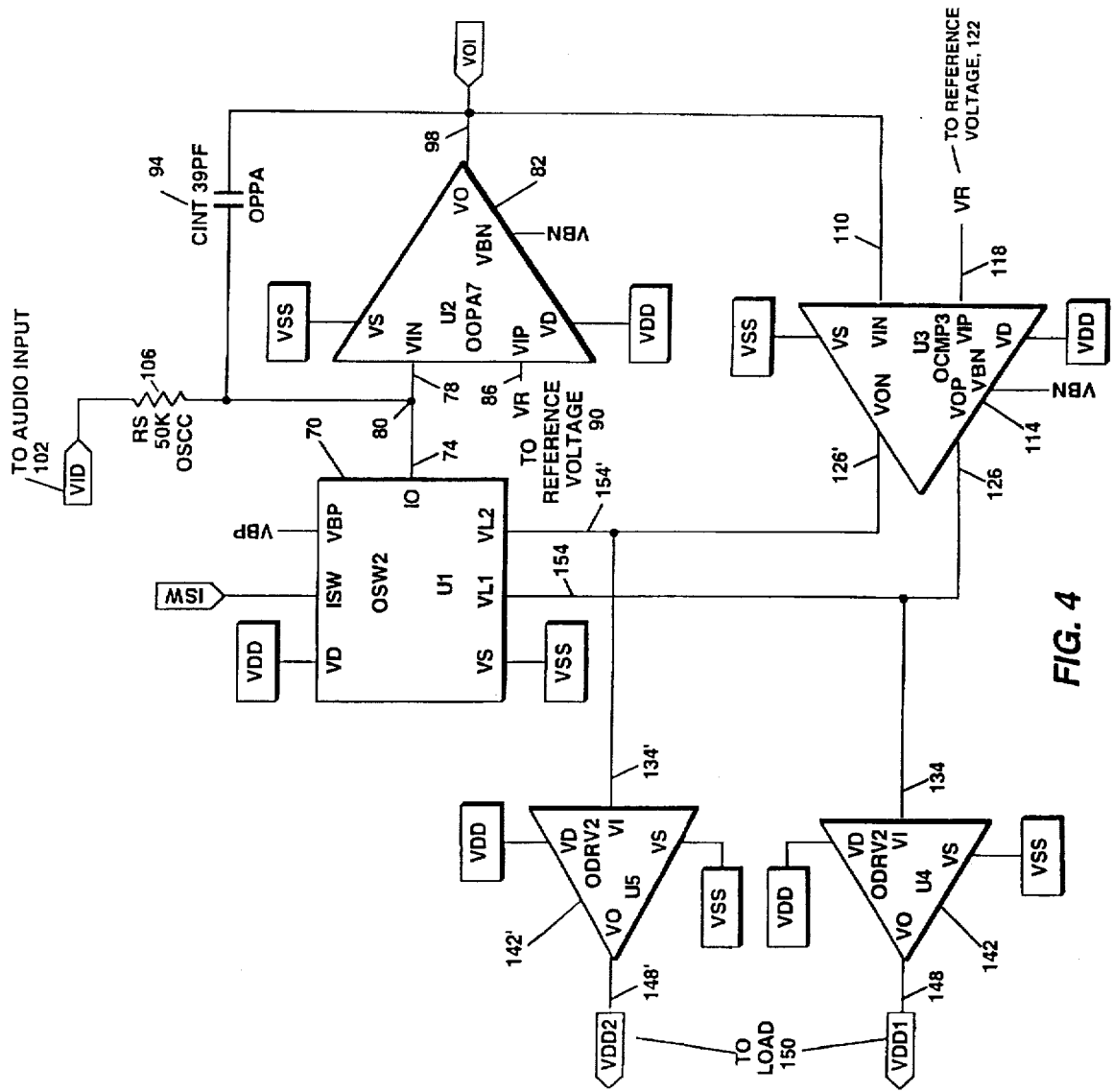
FIG. 4 is a schematic diagram of an embodiment of a circuit corresponding to the block diagram of FIG. 2.

FIG. 4 is a schematic diagram of a circuit corresponding to the block diagram of FIG. 2. As described previously, the output 74 of current switch 70 is applied to the negative input terminal 78 of operational amplifier 82 connected as an integrator. In one embodiment, an audio signal is applied to negative input 78 from audio input 102 through a 50 kΩ resistor 106. In this embodiment, the maximum audio input signal is 200 mV peak, assuming a 5 µA input current. The maximum frequency of the input signal is the carrier frequency of the circuit divided by 2.

A 39 pF capacitor is connected between the negative input terminal 78 and the output terminal 98 of the operational amplifier 82. The positive input terminal 86 is connected to a reference voltage and the output terminal 98 is connected to the input terminal 110 of comparator 114. The other input of the comparator 118 is connected to a reference voltage 122. In the embodiment shown, the reference voltages for both the integrator 82 and the comparator 112 are set arbitrarily to 0.75 V. The output terminals 126, 126' are connected to the input terminals 134, 134', respectively, of amplifiers 142, 142', respectively. The output terminals 148, 148' are connected to a transducer load 150. The transducer load is primarily inductive with a series resistance. The load will typically have an inductance of 60 mH and between 50 and 800 ohms resistance. The output terminals 126, 126' of comparator 114 are also connected to the input terminals 154, 154', respectively, of current amplifier 70, thereby completing the feedback loop. Each of the components of this circuit will now be described in detail.

Figure 5:
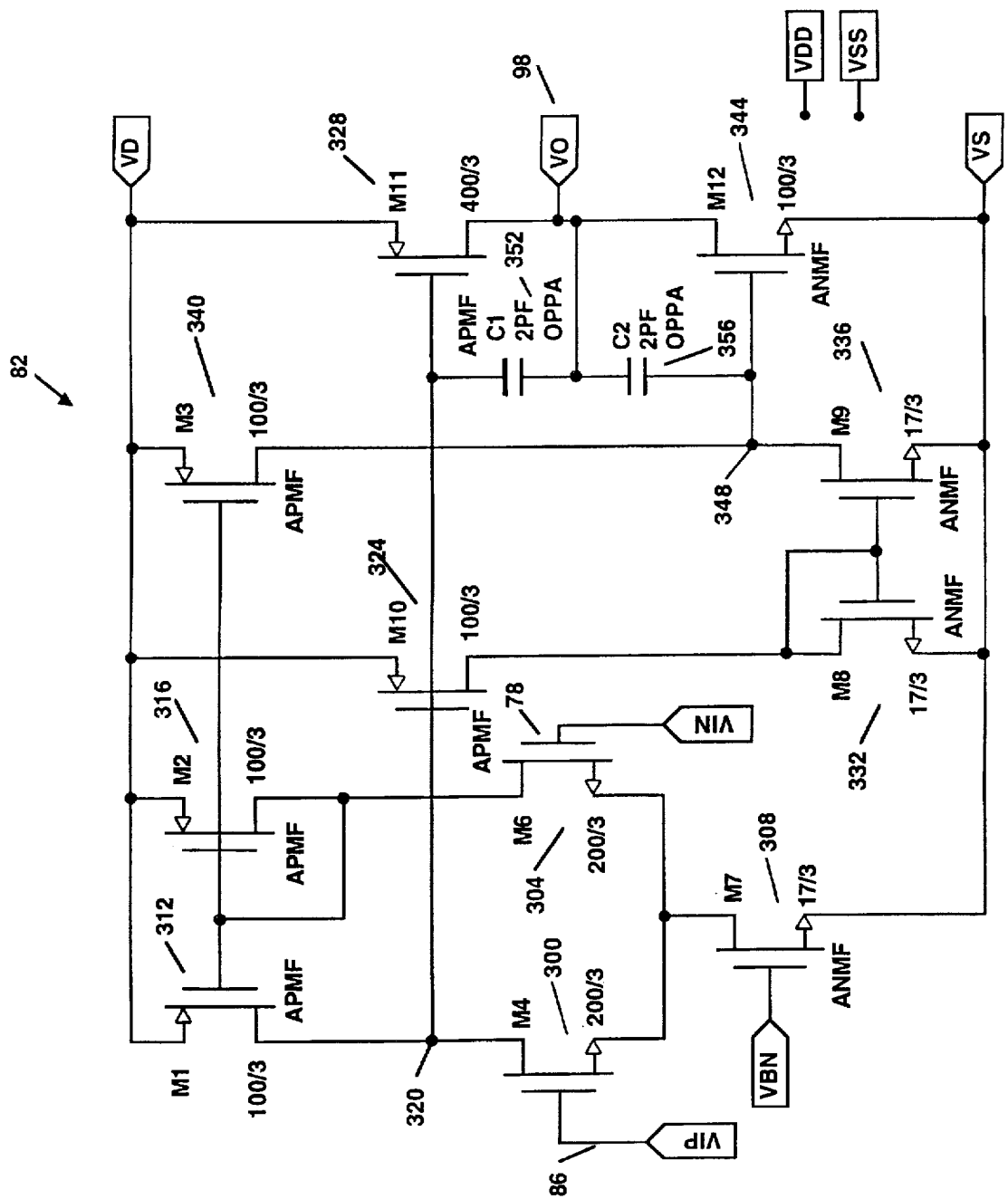
FIG. 5 is a schematic diagram of an embodiment of the operational amplifier of FIG. 4.

A schematic diagram of an embodiment of the operational amplifier 82 depicted in the circuit of FIG. 4, is shown in FIG. 5. Transistors M4 300 and M6 304 are connected as a differential amplifier with transistor M7 308 acting as the current source. Transistors M1 312 and M2 316 are configured as a current mirror which supplies a load to the differential amplifier. Transistors M1 312 and M2 316 convert the output of the differential amplifier to a single ended output at common node 320. Common node 320 is also connected to transistors M10 324 and M11 328, which provide the output stage for the operational amplifier 82; the drain of M11 328 being the output terminal 98 of the operational amplifier 82.

Transistors M10 324, M8 332, M9 336, and M3 340 provide an intermediate stage level shifter to create a non-inverted drive for transistor M12 344 at node 348. This intermediate level shifter shifts the voltage level at node 320 down to that at node 348. Thus node 320 and node 348 change voltage in phase. Node 320 drives transistor M11 328. As node 320 increases in voltage, transistor M11 328 is turned off. Similarly, as node 348 goes up in phase with node 320, transistor M12 344 turns on. Thus node 320 and node 348 are the driving nodes for transistors M11 328 and M12 336 in a push-pull fashion. The intermediate level shifting stage also provides a stable bias current for output stage transistors M11 328 and M12 344. Capacitors C1 352 and C2 356 frequency compensate or frequency stabilize node 320 and node 348.

Figure 6:
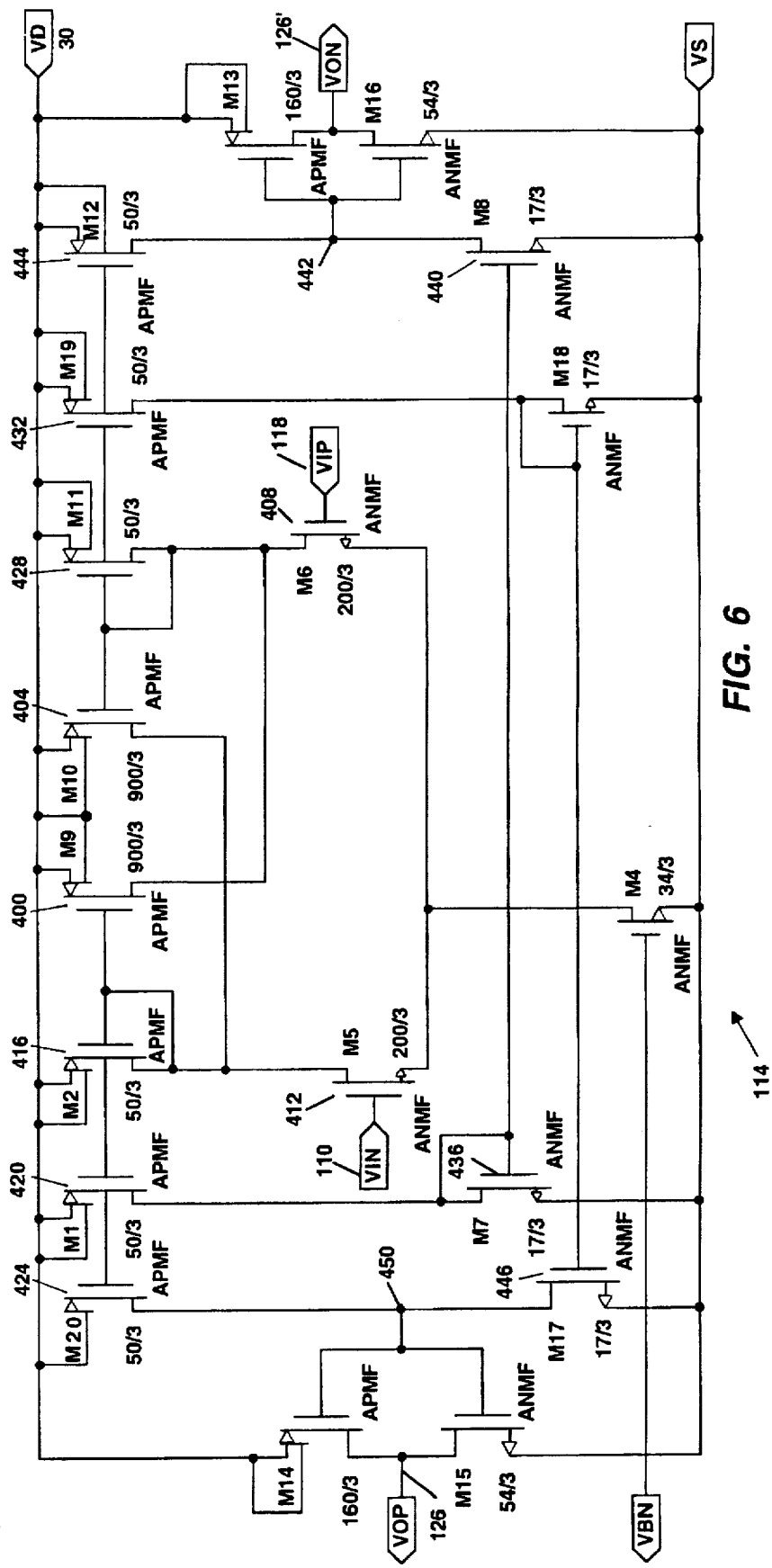
FIG. 6 is a schematic diagram of an embodiment of the comparator of FIG. 4.

FIG. 6 is a schematic diagram of an embodiment of the comparator 114 of the circuit of FIG. 4 having hysteresis. In this embodiment, the input signals to the comparator 114 are by way of transistors M6 408 and M5 412 which are coupled to the drains of M9 400 and M10 404, respectively. Transistors M9 400 and M10 404 are cross-coupled. It should be noted that the attributes of M9 400 and M10 404 are selected so that their characteristics are relatively independent of manufacturing process.

The gate (the positive input 118 of comparator 114) of M6 408 is connected to the reference voltage 122. When the input voltage to the negative input 110 of comparator 114, which is the gate of transistor M5 412, is greater than the reference voltage 122 on the gate of transistor M6 408, transistor M5 412 is turned on and transistor M6 408 is turned off. This causes current to flow through M2 416 which is mirrored through transistors M1 420, M9 400 and M20 424. Conversely, transistors M10 404, M12 428 and M19 432, which are current mirrors for transistor M11 428, are turned off. The current flowing in transistor M1 420 flows through transistor M7 436 and is mirrored by transistor M8 440. Because there is no current flowing in transistor M12 444, the common node 442 between transistor M12 444 and transistor M8 440 is low and negative output terminal 126' is high. Transistor M17 446 is off, so common node 450 between transistor M20 424 and transistor M17 446 is high and therefore positive output terminal 126 is low. Thus the input voltage is inverted at the positive output 126.

Conversely, when the input voltage to the negative input 110 of comparator 114, which is the gate of transistor M5 412, is less than the reference voltage 122 on the gate of transistor M6 408, transistor M5 412 turns off and transistor M6 408 turns on. Current flows through transistor M11 428 which is mirrored through transistors M10 424, M12 444 and M19 432. Transistors M1 420, M9 400 and M20 424 which are current mirrors for transistor M2 416 are turned off. Because there is no current flowing in transistor M20 424, the common node 450 between transistor M20 424 and transistor M17 446 is low and positive output terminal 126 is high. Conversely, common node 442 between transistor M8 440 and transistor M12 444 is high and negative output terminal 126' is low. Again the input voltage is inverted at the positive output 126.

The hysteresis in this circuit arises from the interconnections of transistors M9 400, M6 408 and M11 428 and the interconnections of transistors M10 404, M5 412 and M2 416. That is, transistor M11 428 can not switch until the current in M9 400 is overcome by the current in M6 408 as a result of the input value on terminal 118. Once the current in M6 408 exceeds the current in M9 400, M11 428 is turned on, causing the rest of the mirroring to take place and reversing all the voltages at the output terminals 126, 126'. Similarly, transistor M2 416 can not switch until the current in M10 404 is overcome by the current in M5 412 as a result of the input value on terminal 110. Once the current in M5 412 exceeds the current in M10 404, M2 416 is turned on, again reversing all the voltages at the output terminals 126, 126'. Without transistors M9 400 and M10 404, the comparator 114 would behave as a standard comparator without hysteresis. The hysteresis switching values, both high and low, are symmetric about the reference voltage and hence are relatively insensitive to the reference voltage value.

Figure 7:
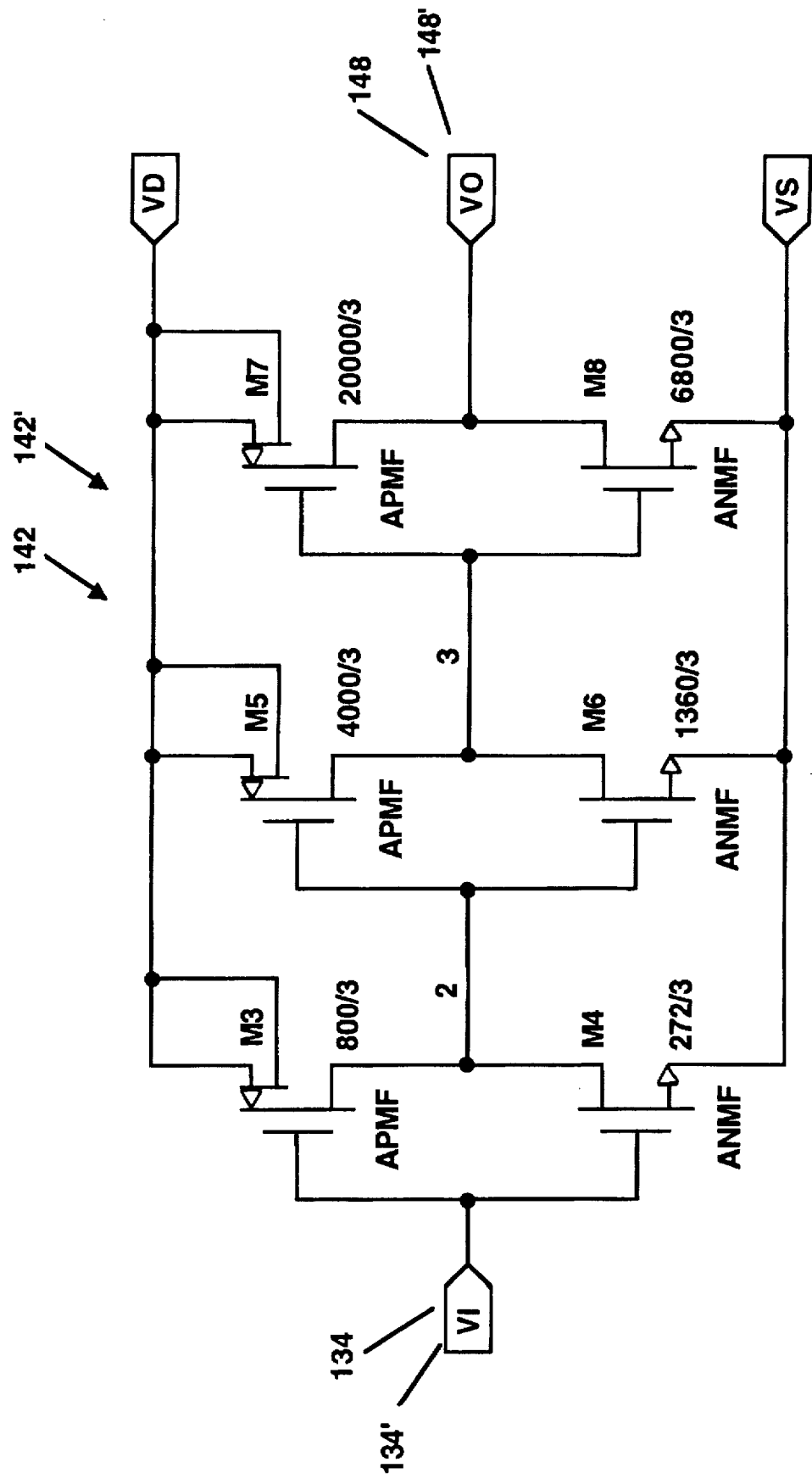
FIG. 7 is an embodiment of the driver of FIG. 4.

FIG. 7 is a schematic diagram of an embodiment of the power driver 142, 142'. Each power driver 142, 142' is a series of progressively larger inverters to produce more output drive current.

Figure 8:
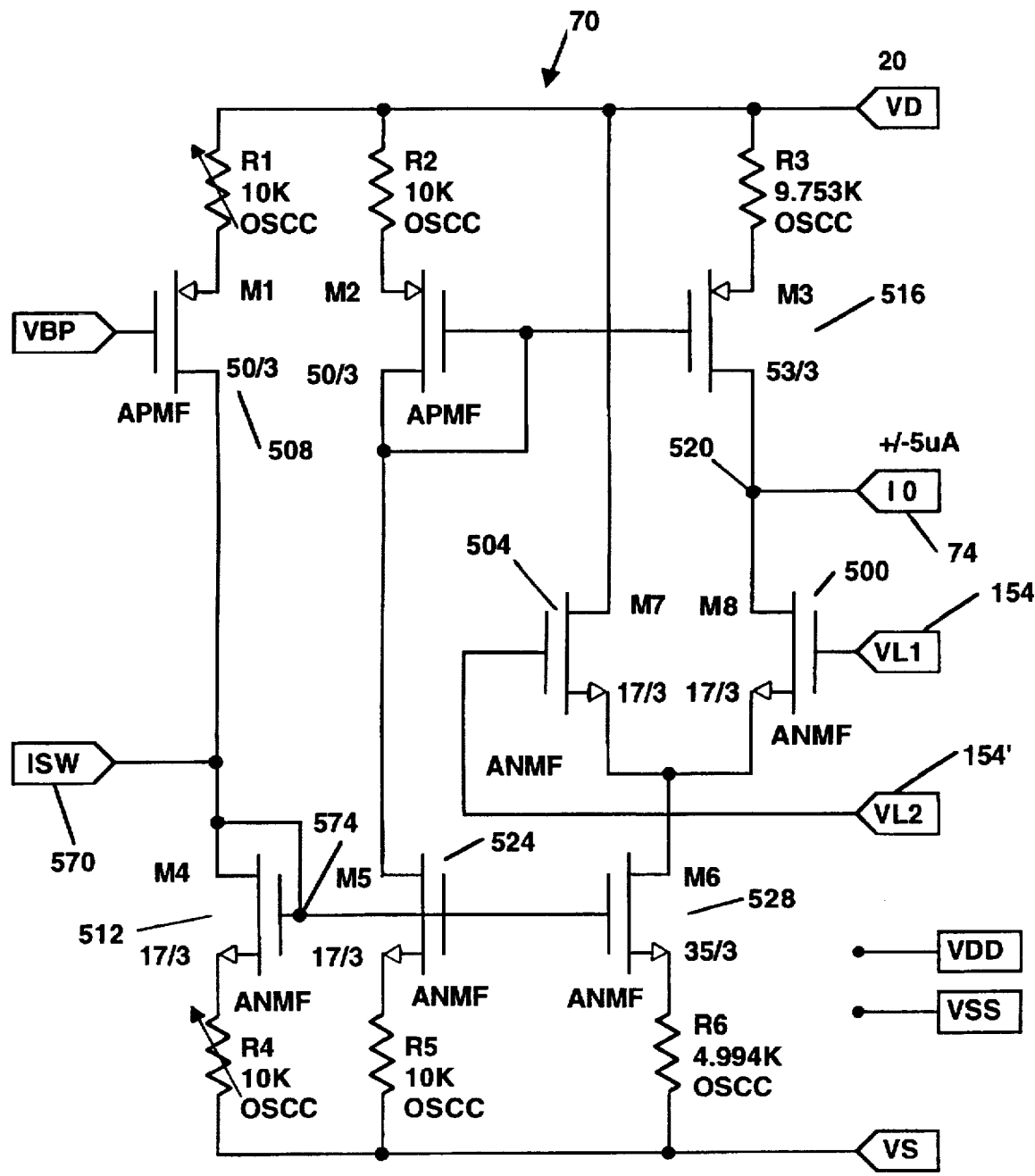
FIG. 8 is a schematic diagram of an embodiment of the current switch of FIG. 4.

FIG. 8 is a schematic diagram of an embodiment of the current switch 70 which may be used with gain compression circuitry. The input terminals 154, 154' of the current switch are connected to the gates of transistors M8 500 and M7 504. A bias voltage applied to transistor M1 508 acts as a current source to transistor M4 512. Transistor M3 516 is a current source for common node 520 between transistor M3 516 and transistor M8 500. Transistors M4 512, M5 524 and M6 528 act as a current mirror with transistor M6 528 carrying twice the current of transistor M4 512.

The voltages from the comparator 114 on the input terminals 154, 154' cause transistors M8 500 and M7 504 to switch. Since the voltages from the comparator 114 are out of phase, when the voltage on terminal 154 is high and the voltage on terminal 154' is low, transistor M8 500 is on and transistor M7 504 is off. When transistor M8 500 is on, it is sinking current from both M3 516 and the output terminal 74, and the current switch acts as a sink.

When the voltage on terminal 154' is high and the voltage on terminal 154 is low, transistor M8 500 is off and transistor M7 504 is on. When transistor M8 500 is off, it is not sinking current so the current from M3 516 is passed through the output terminal 74, and the current switch acts as a current source. Thus, the current switch 70 is constructed to either source or sink current to node 80 (FIG. 2) in response to the output of the comparator 114, thereby providing the feedback response necessary for oscillation of the circuit.

Figure 9:
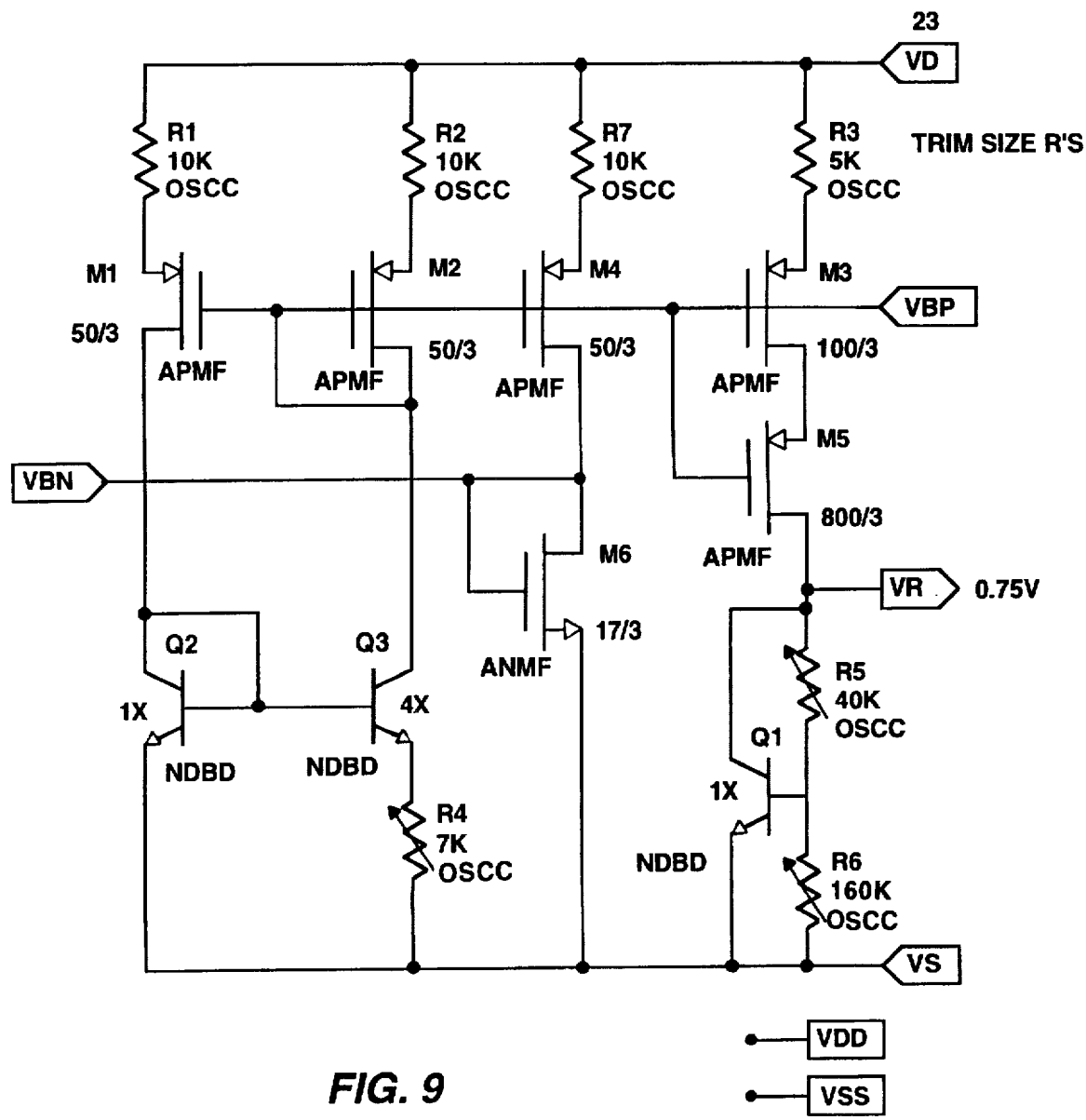
FIG. 9 is a schematic diagram of an embodiment of a bias current cell which provides the bias current and the reference voltages to the other components in the circuit of FIG. 4.

FIG. 9 is a schematic diagram of a bias current cell which provides a supply independent reference voltage and bias voltage. This circuit contributes to the stable operation of the circuit despite power supply and temperature fluctuations. In this embodiment several of the resistors are constructed to be laser trimmable to permit the circuit to be modified during testing if required.

Figure 10:
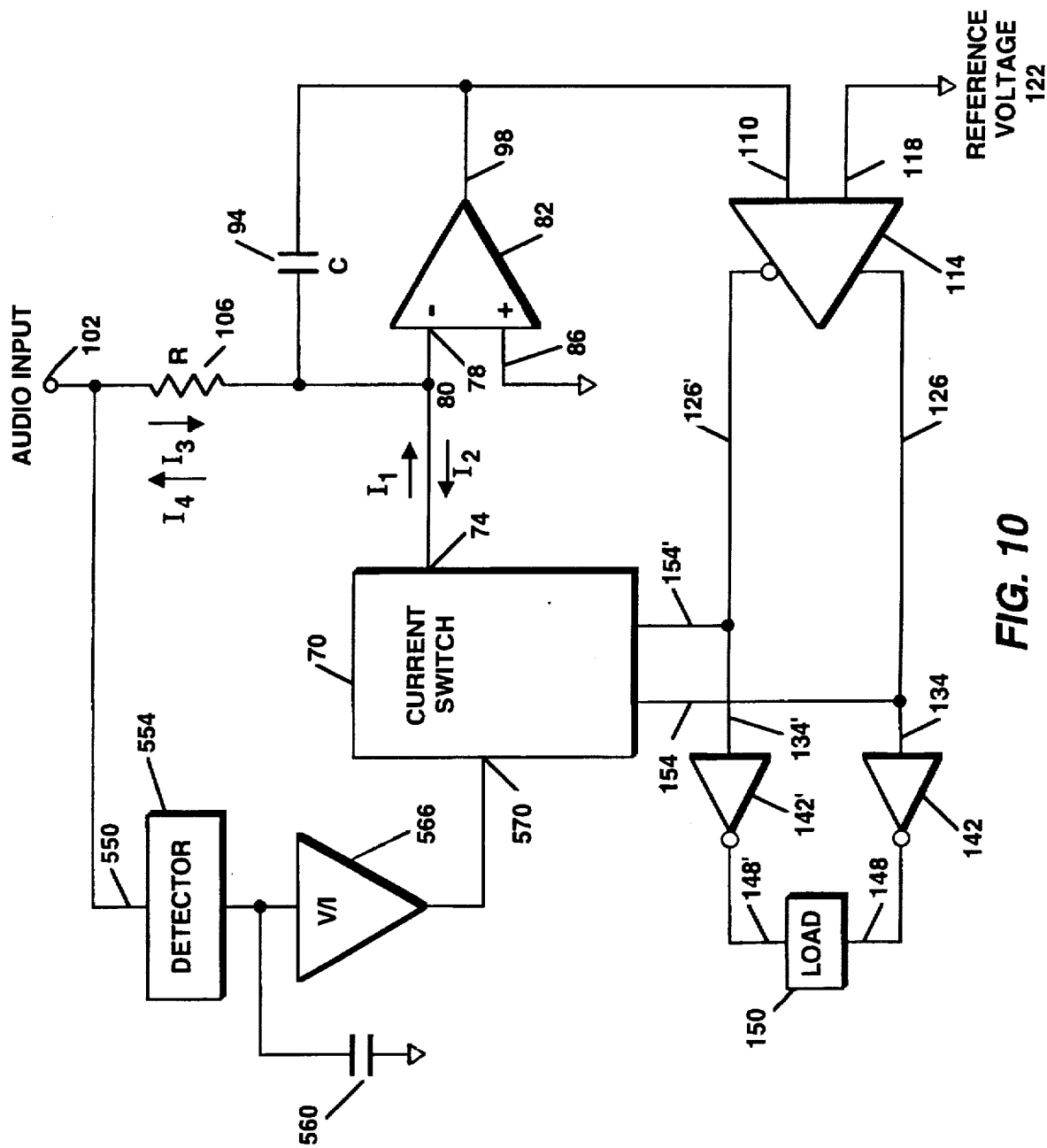
FIG. 10 is a block diagram of an embodiment of a circuit corresponding to the block diagram of FIG. 2 with added gain compression circuitry.

Gain compression circuitry may be added to the embodiment of the circuit of FIG. 2 as shown in FIG. 10. Gain compression circuitry is typically is used in audio amplifiers to prevent the amplifier from being overdriven and causing distortion. In the embodiment shown the input terminal 550 of a detector 554 is connected to the audio input 102. The output signal from the detector 554 is integrated by a capacitor 560 and the integrated signal is the input signal to a transconductance amplifier (voltage to current converter) 566. The output of the transconductance amplifier 566 is applied to gain control terminal 570 of the current switch 70.

Referring also to FIG. 8, the detector 554 detects the input audio signal magnitude from the audio input 102 and the transconductance amplifier 566 converts the detected signal to a current which is proportional to input voltage. This current is summed at node 574 of the current switch 70. This summed current results in a compression of the gain transfer function of the amplifier, shown as follows.

The gain (A) of the class-D amplifier is given by the expression:

$$A = V_{out}/V_{audio}$$

where $V_{out}$ is the voltage at output terminals 148 and $V_{audio}$ is the voltage of the audio signal at the audio input terminal 102. Before the threshold for compression is reached, $$A = K/I_1$$

where K is the scaling factor for the amplifier and $I_1$ (or $I_2$) is the current sourced or sunk by the current 70.

Once the threshold for compression is reached, $$I_1 = I_{DC} + I_{transconductance}$$

where $I_{DC}$ is the DC current level from the current switch 70, and $I_{transconductance}$ is the current summed at node 574 from the transconductance amplifier 566. The current, $I_{transconductance}$, is given by the expression:

$$I_{transconductance} = V_{detected}/R_{transconductance}$$

where $V_{detected}$ is the detected audio voltage and $R_{transconductance}$ is the resistance of the transconductance amplifier 566. Combining these equations, the output voltage $V_{out}$ is therefore given by the expression:

$$V_{out} = (K\ R_{transconductance}\ V_{audio})/(R_{transconductance}\ I_{DC} + V_{audio})$$

Note that the output voltage is no longer a linear function of the input voltage.

Figure 11:
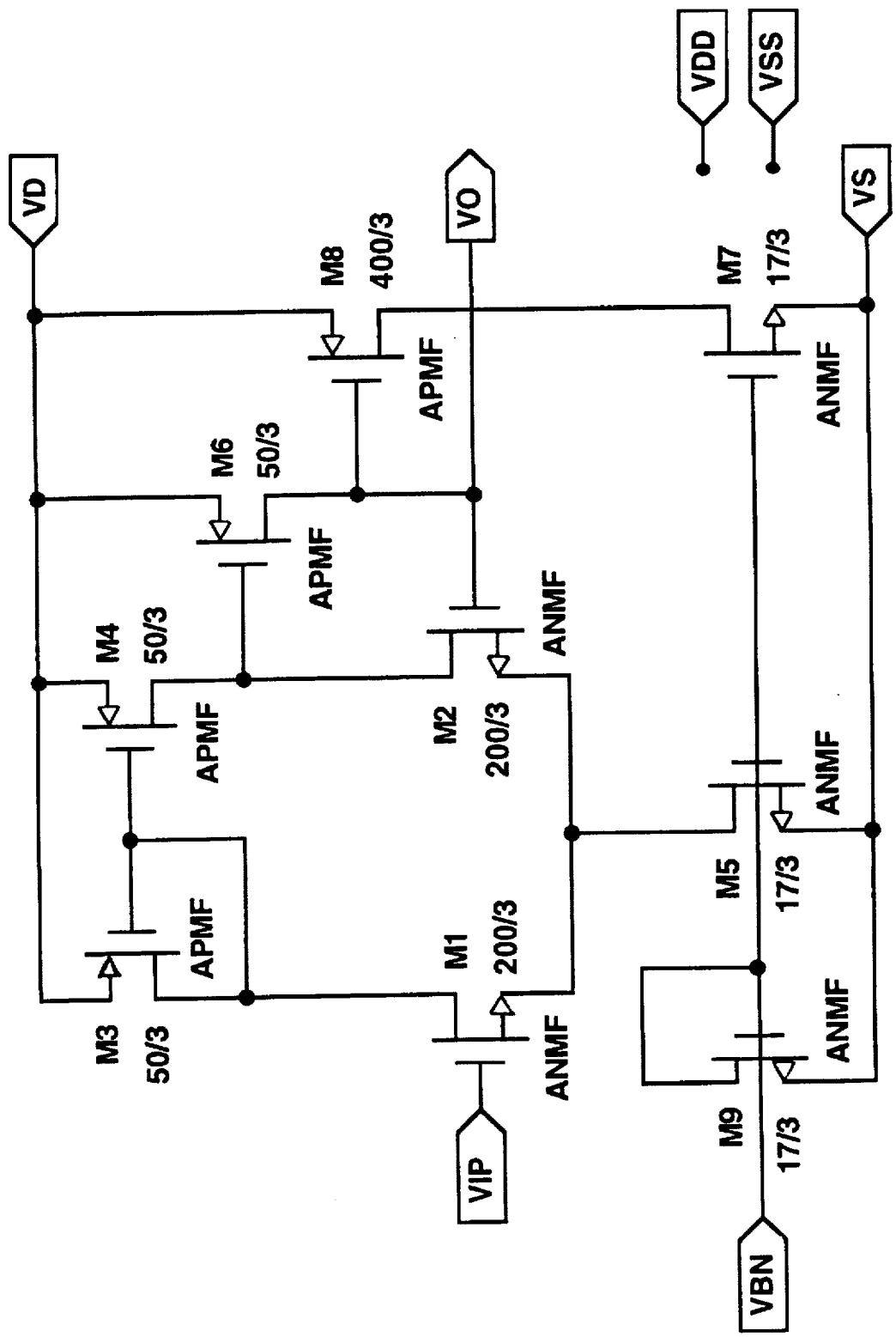
FIG. 11 is a schematic of an embodiment of a detector of the embodiment of the circuit shown in FIG. 10.
Figure 12:
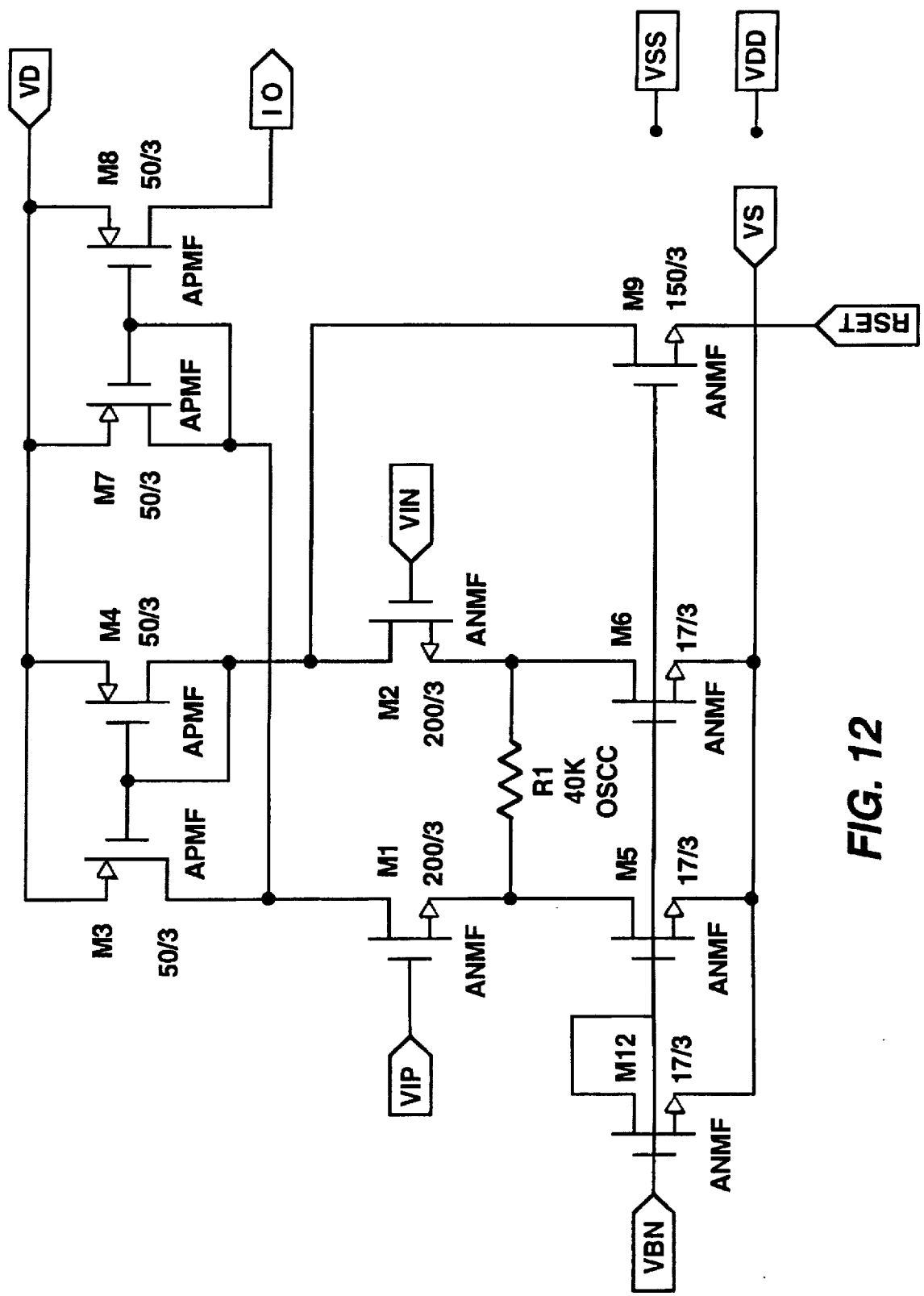
FIG. 12 is a schematic of an embodiment of a transconductance amplifier of the embodiment of the circuit shown in FIG. 10.

FIG. 11 is a schematic diagram of an embodiment of a detector circuit for use with the gain compression circuit of FIG. 10, and FIG. 12 is an embodiment of a transconductance amplifier with the gain compression circuit of FIG. 10.

Having shown the preferred embodiment, those skilled in the art will realize many variations are possible which will still be within the scope and spirit of the claimed invention. Therefore, it is the invention to limit the invention only as indicated by the scope of the claims.

I claim:
1. A pwm amplifier comprising:
   a current source and sink having first and second input control terminals and an output terminal, said current source and sink sourcing and sinking current in response to first and second feedback signals applied to said first and second input control terminals;
   an integrator having an input terminal electrically coupled to said output terminal of said current source and sink and an output terminal; and
   a hysteresis switching comparator having a first input terminal electrically coupled to said output terminal of said integrator and first and second output terminals electrically coupled to said first and second input control terminals of said current source and sink, said first and second output terminals of said hysteresis switching comparator providing said first and second feedback signals;
   said current source and sink, said integrator, and said hysteresis switching comparator thereby being connected as a feedback loop and generating a carrier frequency for said pwm amplifier.

2. The pwm amplifier of claim 1, wherein said output terminal of said integrator provides an integrated output signal, and wherein said hysteresis switching comparator produces a differential output signal between said first and second output terminals in response to said integrated output signal.

3. The pwm amplifier of claim 1 further comprising a first and a second buffer driver, each said buffer driver having an input terminal and an output terminal, wherein said first output terminal of said hysteresis switching comparator is electrically coupled to said input terminal of said first buffer driver and said second output terminal of said hysteresis switching comparator is electrically coupled to said input terminal of said second buffer driver.

4. The pwm amplifier of claim 3 wherein said output terminal of each of said buffer drivers is electrically coupled to a respective terminal of a load.

5. The pwm amplifier of claim 4 wherein said load is an audio transducer.

6. The pwm amplifier of claim 1 wherein said pwm further comprises an audio input terminal electrically coupled to said input terminal of said integrator, said audio input terminal providing an audio input signal to said pwm amplifier.

7. The pwm amplifier of claim 6 further comprising a detector serially electrically coupled to a transconductance amplifier, said detector and said transconductance amplifier electrically coupled to said audio input and producing a current in response to and proportional to the magnitude of an input signal on said audio input terminal, said detector and said transconductance amplifier electrically coupled to said current source and sink so as to produce a compression in the gain of said pwm amplifier.

8. A hearing aid comprising: a pwm amplifier comprising:
   a current source and sink having a first input control terminal, a second input control terminal, and an output terminal, said current source and sink sourcing and sinking current in response to a first feedback signal applied to said first input control terminal and a second feedback signal applied to said second input control terminal;
   an integrator having an input terminal electrically coupled to said output terminal of said current source and sink and an output terminal;
   a hysteresis switching comparator having a first input terminal electrically coupled to said output terminal of said integrator, a first output terminal electrically coupled to said first input control terminal of said current source and sink, and a second output terminal electrically coupled to said second input control terminal of said current source and sink, said first and second output terminals of said hysteresis switching comparator providing said first and second feedback signals;

said current source and sink, said integrator, and said hysteresis switching comparator thereby being connected as a feedback loop and generating a carrier frequency for said pwm amplifier;

a first and a second buffer driver, each said buffer driver having an input terminal and an output terminal, said first output terminal of said hysteresis switching comparator electrically coupled to said input terminal of said first buffer driver and said second output terminal of said hysteresis switching comparator electrically coupled to said input terminal of said second buffer driver, said output terminal of each of said buffer drivers electrically coupled to a respective terminal of an audio transducer; and an audio input terminal electrically coupled to said input terminal of said integrator, said audio input terminal providing an audio input signal to said pwm amplifier.

9. A comparator comprising:

a first input terminal;

a second input terminal;

a first output terminal;

a second output terminal;

a first FET having a drain terminal, a gate terminal in electrical communication with said first input terminal, and a source terminal in electrical communication with a first power supply terminal;

a second FET having a drain terminal, a gate terminal in electrical communication with said second input terminal, and a source terminal in electrical communication with said first power supply terminal;

a third FET having a source terminal in electrical communication with a second power supply terminal, a drain terminal in electrical communication with said drain terminal of said second FET, and a gate terminal in electrical communication with said first output terminal;

a fourth FET having a source terminal in electrical communication with said second power supply terminal, a drain terminal in electrical communication with said drain terminal of said first FET, and a gate terminal in electrical communication with said second output terminal;

a fifth FET having a source terminal in electrical communication with said second power supply terminal, a drain terminal in electrical communication with said drain terminal of said second FET, and a gate terminal in electrical communication with said drain terminal of said first FET and in electrical communication with said gate terminal of said fourth FET; and a sixth FET having a source terminal in electrical communication with said second power supply terminal, a drain terminal in electrical communication with said drain terminal of said first FET, and a gate terminal in electrical communication with said drain terminal of said second FET and in electrical communication with said gate terminal of said third FET.

\* \* \* \* \*